United States Patent
Matero et al.

(10) Patent No.: US 7,742,748 B2
(45) Date of Patent: Jun. 22, 2010

(54) SIGNAL PREDISTORTION IN RADIO TRANSMITTER

(75) Inventors: Jorma Matero, Oulu (FI); Marko J. Alanen, Espoo (FI); Jussi H. Vepsäläinen, Helsinki (FI); Jaako Maunuksela, Espoo (FI)

(73) Assignee: Nokia Corporation, Espoo (FI)

( * ) Notice: Subject to any disclaimer, the term of this patent is extended or adjusted under 35 U.S.C. 154(b) by 649 days.

(21) Appl. No.: 11/657,542

(22) Filed: Jan. 25, 2007

(65) Prior Publication Data
US 2008/0139140 A1  Jun. 12, 2008

(30) Foreign Application Priority Data
Dec. 8, 2006  (FI)  .................................. 20065783

(51) Int. Cl.
*H04B 1/04* (2006.01)
*H04K 3/00* (2006.01)
(52) U.S. Cl. ...................... 455/114.3; 330/149; 375/296
(58) Field of Classification Search ............. 455/114.3; 330/149; 375/296–297
See application file for complete search history.

(56) References Cited

U.S. PATENT DOCUMENTS

| 5,091,919 | A | 2/1992 | Kuisma |
| 5,123,031 | A | 6/1992 | Kuisma |
| 6,774,719 | B1 * | 8/2004 | Wessel et al. ............... 330/136 |
| 2006/0091950 | A1 * | 5/2006 | Hayase ....................... 330/149 |

FOREIGN PATENT DOCUMENTS

EP  1 672 783  6/2006

* cited by examiner

*Primary Examiner*—Lee Nguyen
(74) *Attorney, Agent, or Firm*—Squire, Sanders & Dempsey, LLP (57) ABSTRACT

A transmission signal to be transmitted from a radio transmitter is predistorted in order to compensate for the signal distortion caused by a power amplifier. The transmission signal and a signal modeling a power supply voltage applied to the power amplifier are compared with distortion properties of the power amplifier using these signals. The distortion information is comprised in an amplitude distortion lookup table and a phase distortion lookup table. Transmission signal and power supply signal values are associated with envelope and phase predistortion information comprised in the respective lookup tables and the envelope and the phase of the transmission signal is predistorted accordingly.

31 Claims, 5 Drawing Sheets

SIGNAL PREDISTORTION IN RADIO TRANSMITTER

FIELD

The invention relates generally to radio transmitters and particularly to predistortion of a transmission signal before power amplification.

BACKGROUND

In radio transmitters, a transmission signal, i.e. the signal being transmitted, is amplified in a radio frequency power amplifier which amplifies the transmission signal to a level suitable for transmission over an air interface to a radio receiver. The level of the power-amplified transmission signal should be high enough to enable the radio receiver to decode information contained in the transmission signal.

Power amplifiers are not ideal components and thus power amplification does not result in an ideally power-amplified transmission signal. Instead, the power-amplified transmission signal is corrupted by amplitude and phase distortion caused by the power amplifier. If this distortion is not corrected before transmission or at the radio receiver, the decoding of the information will be hindered at the radio receiver.

The amplitude and phase distortion caused by the power amplifier may be compensated by predistorting the transmission signal before the power amplification. One known transmission signal predistortion method monitors constantly the amplitude and phase distortion affected by the power amplifier. Accordingly, the solution comprises a feedback loop for the power-amplified transmission signal to enable measurement of the amplitude and phase distortion caused by the power amplifier. On the basis of the measured distortion values, predistortion values are calculated for the amplitude and phase of the transmission signal, and the transmission signal is predistorted with these predistortion values before power amplification. This solution ensures that the predistortion values are always up-to-date, but the solution requires excessive amount of signal processing which requires high computational capacity and consumes power. Both of these issues are critical in a mobile communication device which operates with a battery and is desired to be compact in size. Therefore, there is a need for simpler, yet efficient, predistortion solutions.

BRIEF DESCRIPTION OF THE INVENTION

An object of the invention is to provide an improved solution for predistorting a transmission signal in order to overcome signal distortion caused by a power amplifier.

According to an aspect of the invention, there is provided a transmission signal predistortion method. The method comprises receiving a transmission signal to be transmitted and a signal modeling a power supply voltage applied to a power amplifier, associating an envelope of the received transmission signal and the signal modeling the power supply voltage with predistortion information comprised in a distortion lookup table, wherein the information in the distortion lookup table is obtained beforehand from transmission signal distortion properties of the power amplifier and remains substantially fixed over time, and predistorting the received transmission signal according to the associated predistortion information in order to compensate the distortion caused by the power amplifier.

According to another aspect of the invention, there is provided an apparatus comprising a predistortion unit. The predistortion unit comprises an interface to receive a transmission signal to be transmitted and a signal modeling a power supply voltage applied to a power amplifier, the predistortion unit being configured to associate an envelope of the received transmission signal and the signal modeling the power supply voltage with predistortion information comprised in a distortion lookup table, wherein the information in the distortion lookup table is obtained beforehand from transmission signal distortion properties of the power amplifier and remains substantially fixed over time, and predistort the received transmission signal according to the associated predistortion information in order to compensate the distortion caused by the power amplifier.

According to another aspect of the invention, there is provided a radio transmitter comprising the above-mentioned apparatus.

According to another aspect of the invention, there is provided a computer program product encoding a computer program of instructions for executing a computer process for transmission signal predistortion according the method described above.

According to another aspect of the invention, there is provided a computer program distribution medium readable by a computer and encoding a computer program of instructions for executing a computer process for transmission signal predistortion according to the method described above.

LIST OF DRAWINGS

In the following, the invention will be described in greater detail with reference to the embodiments and the accompanying drawings, in which.

DESCRIPTION OF EMBODIMENTS

Figure 1:
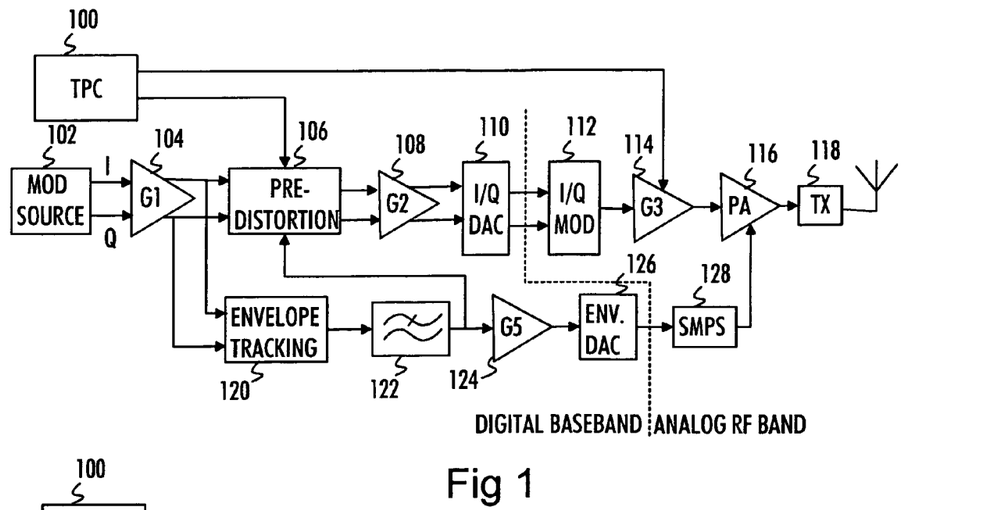
FIG. 1 is a block diagram illustrating components of a radio transmitter according to an embodiment of the invention.

FIG. 1 is a block diagram illustrating components of a radio transmitter according to an embodiment of the invention. The block diagram of FIG. 1 illustrates components related to predistortion and power amplification of a transmission signal. All of the components illustrated in FIG. 1 are obviously not necessary for carrying out the invention.

In FIG. 1, a modulation source 102 provides a transmission signal comprising information symbols to be transmitted from the radio transmitter to a radio receiver. The transmission signal is in a digital form and divided into an in-phase (I) component and a quadrature (Q) component. The transmission signal is then fed to a first scaling circuit 104 which scales (amplifies) the transmission signal to a desired level suitable for an envelope tracking unit 120 and a predistortion unit 106. The first scaling unit 104 may additionally receive a control signal from a transmit power control signal generation unit 100, and perform the scaling under the control of the received control signal. The transmit power control signal generation unit 100 may generate the control signal on the basis of transmit power control commands received from a radio receiver communicating with the radio transmitter. The envelope tracking unit 120 and the predistortion unit 106 may have certain requirements regarding the level of their corresponding input signals. For example, they may operate with a finite word length and, thus, require that the input signals have a level high enough to enable efficient use of the dynamic range of the units 106 and 120.

The envelope tracking unit 120 receives the I and Q component of the transmission signal as input signals and detects an envelope of the transmission signal from the I and Q component. From the envelope of the transmission signal, the envelope tracking unit 120 may calculate a power supply control signal which is used for controlling a power supply voltage applied to a power amplifier 116. The envelope tracking unit 120 may include a non-linear filter which filters the power supply control signal such that the rise time of the signal is preserved and the fall time of the signal is lengthened. For example, if an input signal to the non-linear filter contains a sharp peak having a fast rise time and a fast fall time, the output signal of the non-linear filter contains a smoothed peak having a fast rise time but a slow fall time. Additionally, the non-linear filter may limit the fluctuation levels of the input signal between a given maximum and minimum level. The operation of the non-linear filter is described in greater detail in the applicant's earlier U.S. patent application Ser. No. 11/418,831 which is incorporated herein as a reference. The invention is, however, not limited to the envelope tracking unit 120 described above and, therefore, utilization of other types of envelope tracing units is possible for implementing the invention.

The envelope tracking unit 120 may output the filtered power supply control signal into a low-pass filter 122, which has a corner frequency lower than that of an envelope digital-to-analog (D/A) converter 126, and to a power supply signal generator 128 following the low-pass filter. By limiting the frequency band of the power supply control signal it is possible to improve the similarity between an output signal of the low-pass filter 122 and an output signal of the power supply signal generator 128. The similarity between these signals is an important feature when predistorting the transmission signal to compensate for distortion caused by the power amplifier. The low-pass filtered power supply control signal is then applied to the predistortion unit 106 and to a second scaling unit 124.

The predistortion unit 106 receives the scaled I and Q components of the transmission signal output from the first scaling unit 104 and the filtered power supply control signal output from the non-linear filter 122. The predistortion unit 106 uses the filtered power supply control signal as a signal modeling a power supply voltage applied to the power amplifier 116. The predistortion unit 106 additionally receives a transmit power control signal from the transmit power control signal generation unit 100. The predistortion unit 106 may have knowledge on the amplitude and phase distortion properties of the power amplifier 116 and it may predistort the transmission signal (I and Q component) to compensate for the distortion caused by the power amplifier 116. The operation of the predistortion unit 106 will be described in detail with reference to FIGS. 3 to 6. The predistortion unit 106 outputs the predistorted transmission signal into a third scaling unit 108.

The third scaling unit 108 scales the predistorted transmission signal to a level suitable for an I/Q D/A converter 110. The scaling performed by the third scaling unit may also be controlled by a control signal provided by the transmit power control signal generation unit 100. Accordingly, the third scaling unit 108 may scale the input signal to a level at which the dynamic range of the I/Q D/A converter 110 is efficiently utilized. The I/Q D/A converter converts the digital I and Q components into analog signals and feeds them to an I/Q modulator 112. The I/Q modulator 112 converts the baseband digital I and Q components of the transmission signal into a radio frequency (RF) signal. The I/Q modulator 112 modulates a carrier signal according to the information contained in the I or Q component of the transmission signal. A separate carrier is modulated for each I and Q component and a phase shift between the two carriers is typically 90 degrees. The carriers are then summed together to provide a RF transmission signal.

The RF transmission signal is then fed to an amplifier 114 which amplifies the RF transmission signal according to a control signal provided by the transmit power control signal generation unit 100. Accordingly, the amplifier 114 amplifies the RF transmission signal according to the transmit power control commands and then outputs the amplified RF transmission signal to the power amplifier 116.

The power amplifier 116 receives a power supply voltage from a power supply voltage generator 128, which may be a switched-mode power supply (SMPS), for example. The power supply voltage provided by the power supply voltage generator 128 is controlled by the power supply control signal provided by the envelope tracking unit 120. As mentioned above, the power supply control signal is filtered by the low-pass filter 122 which feeds the filtered power supply control signal to the fourth scaling unit 124. The fourth scaling unit 124 scales the filtered power supply control signal to an operational range of an envelope D/A converter 126 which converts the digital power supply control signal into an analog form suitable for inputting to the power supply voltage generator 128. The power supply voltage generator 128 then outputs a power supply voltage corresponding to the input control signal.

The power amplifier 116 then amplifies the transmission signal according to the power supply voltage provided by the power supply voltage generator 128 and applies the power-amplified transmission signal to RF front-end components 118 for transmission through an antenna.

The purpose of controlling the power supply voltage according to the envelope of the transmission signal is to improve the efficiency of the power amplifier. In other words, the purpose is to provide the power amplifier enough power supply voltage to prevent clipping of the transmission signal, but not too much in order to prevent excessive power consumption in the radio transmitter.

Figure 2:
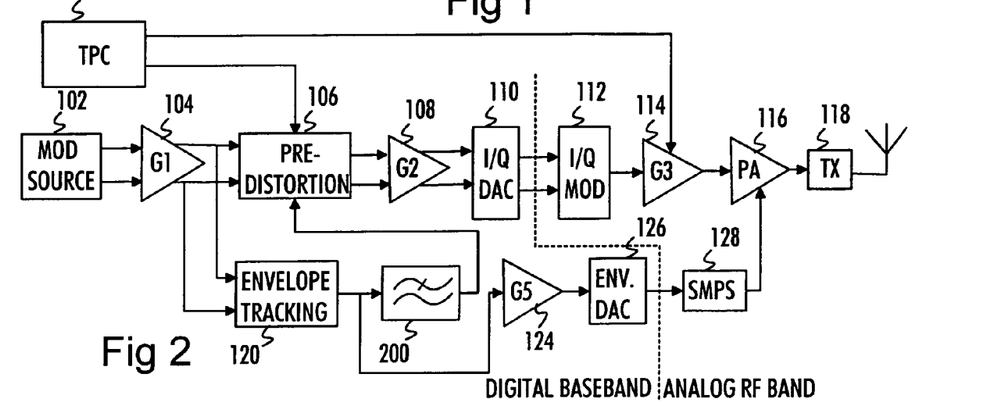
FIG. 2 is a block diagram illustrating components of a radio transmitter according to another embodiment of the invention.

FIG. 2 illustrates another embodiment of the invention related to predistortion of the transmission signal before power amplification. The components denoted with the same numerals as in FIG. 1 have the same, above-described functionality. In this embodiment, the low-pass filter 122 is replaced with a filter 200 having a frequency response designed according to the combined frequency response of the second scaling unit 124, the envelope D/A converter, and the power supply voltage generator 128. Here, the filter 200 receives the power supply control signal provided by the envelope tracking unit 120 and filters it to provide an output signal that models the power supply voltage applied to the power amplifier 116. The output signal modeling the power supply voltage applied to the power amplifier 116 is then fed from the filter 200 to the predistortion unit which uses the output signal when predistorting the transmission signal. The power supply control signal output from the envelope tracking unit 120 is applied also to the second scaling unit 124. Otherwise, the signal flow is similar to that described above with reference to FIG. 1.

Next, operation of the predistortion block 106 according to an embodiment of the invention will be described with reference to FIG. 3. As mentioned above, the predistortion unit 106 receives the transmission signal (I and Q component) I_IN and Q_IN, signal Vcc modeling the power supply voltage applied to the power amplifier 116, and the transmit power control signal as input signals. The received transmission signal comprising the I component I_IN and the Q component Q_IN is converted into an envelope component ENV and a phase component PHA in a converter 300. Accordingly, the converter may perform a rectangular-to-polar conversion. The envelope signal ENV is then fed to a scaling unit 302, an envelope predistortion determination unit 304, and a phase predistortion determination unit 306.

The scaling unit 302 may scale the level of the envelope signal according to a transmit power control signal received from the transmit power control signal generation unit 100. Then the scaling unit 302 may output the scaled envelope signal to a divider 308.

Figure 8A:
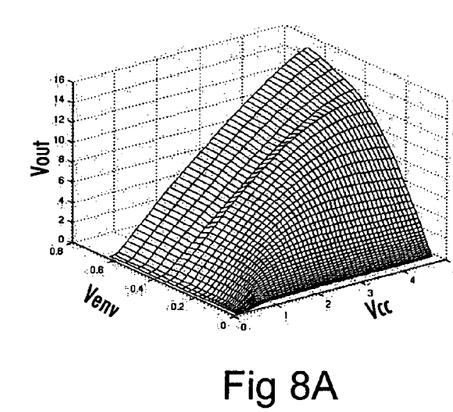
FIG. 8A illustrates the structure of an amplitude distortion lookup table utilized by a transmission signal predistortion unit according to an embodiment of the invention.

The envelope predistortion determination unit 304 receives the envelope signal ENV and the signal Vcc modeling the power supply voltage as input signals. The envelope predistortion determination unit 304 may comprise an amplitude distortion lookup table 316 containing information on amplitude distortion properties of the power amplifier 116. For example, the amplitude distortion lookup table 316 may comprise output voltage values of the power amplifier 116 as a function of an input signal voltage and the power supply signal voltage. As a consequence, the amplitude distortion lookup table 316 may represent the output voltage of the power amplifier 116 as the function of the transmission signal voltage (envelope value) and the power supply signal voltage. The amplitude distortion lookup table 316 may have the form illustrated in FIG. 8A. In FIG. 8A, Venv represents the voltage value of the envelope component ENV. Accordingly, the envelope predistortion determination unit 304 may check the amplitude distortion lookup table 316 in order to map the combination of the voltage levels of the input envelope signal ENV and the signal Vcc modeling the power supply voltage into a given output voltage level determined from the amplitude distortion lookup table 316 and output the output voltage level to the divider 308.

The divider 308 divides the scaled envelope signal by the signal received from the envelope predistortion determination unit 304. The resulting signal is then used when predistorting the envelope of the received transmission signal in a scaling amplifier 312.

Figure 8B:
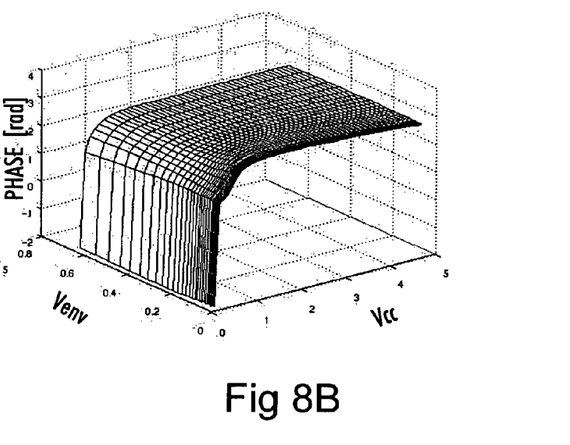
FIG. 8B illustrates the structure of a phase distortion lookup table utilized by a transmission signal predistortion unit according to an embodiment of the invention.

Before the actual envelope predistortion, the phase component PHA of the received transmission signal is predistorted in a subtracter 314 which subtracts from the phase component PHA of the transmission signal a signal received from a phase predistortion determination unit 306. The phase predistortion determination unit 306 may comprise a phase distortion lookup table 318 containing information on phase distortion properties of the power amplifier 116. In more detail, the phase distortion lookup table 318 may comprise output phase values of the power amplifier 116 as a function of an input signal voltage and the power supply signal voltage. As a consequence, the phase distortion lookup table 318 may represent the output phase of the power amplifier 116 in radians as the function of the transmission signal voltage (envelope value) and the power supply signal voltage. The phase distortion lookup table 318 may have the form illustrated in FIG. 8B. Accordingly, the phase predistortion determination unit 306 may check the phase distortion lookup table 318 in order to map the combination of the voltage levels of the input envelope signal ENV and the signal Vcc modeling the power supply voltage into output phase values and output the output phase values to the subtracter 314. The subtracter then subtracts the phase distortion caused by the power amplifier 116 from the phase component PHA of the transmission signal. Actually, the phase distortion lookup table 318 may comprise values indicating the amount of phase distortion the power amplifier adds to its input signal. Accordingly, the amount of phase distortion is then removed from the phase component of the transmission signal beforehand.

The predistorted phase component of the transmission signal, i.e. the output of the subtracter 314, is then fed to an inverse conversion unit 310 together with the envelope component ENV of the transmission signal output from the converter 300. Accordingly, the envelope component ENV may be the original envelope component supplied directly from the converter 300 to the inverse conversion unit 310. The envelope component ENV may have been delayed in order to synchronize it with the predistorted phase component PHA. The inverse conversion unit 310 then converts the envelope component ENV and the phase component PHA into an in-phase component and a quadrature component containing the phase predistortion. The I and the Q component are then fed to the scaling amplifier 312 which predistorts the envelope of the I and the Q component with the output signal of the divider 308. Both I and Q components may be multiplied by the signal output from the divider 308. As a result, the scaling amplifier 312 outputs predistorted I and Q components of the transmission signal. Accordingly, the envelope distortion determination unit 304 may in this embodiment determine and output a weighting signal with which the transmission signal is weighted.

The amplitude and phase distortion lookup tables 316 and 318 may have been calculated at the development or production phase of the radio transmitter and stored into a memory unit of the radio transmitter. Accordingly, the information (the values) in the amplitude and the phase distortion lookup tables 316 and 318 is obtained beforehand and remains substantially fixed over time during the operation of the radio transmitter. Accordingly, there is no need to constantly monitor the distortion properties of the power amplifier 116 during the transmission. This simplifies the operation of the radio transmitter significantly and reduces power consumption.

Figure 3:
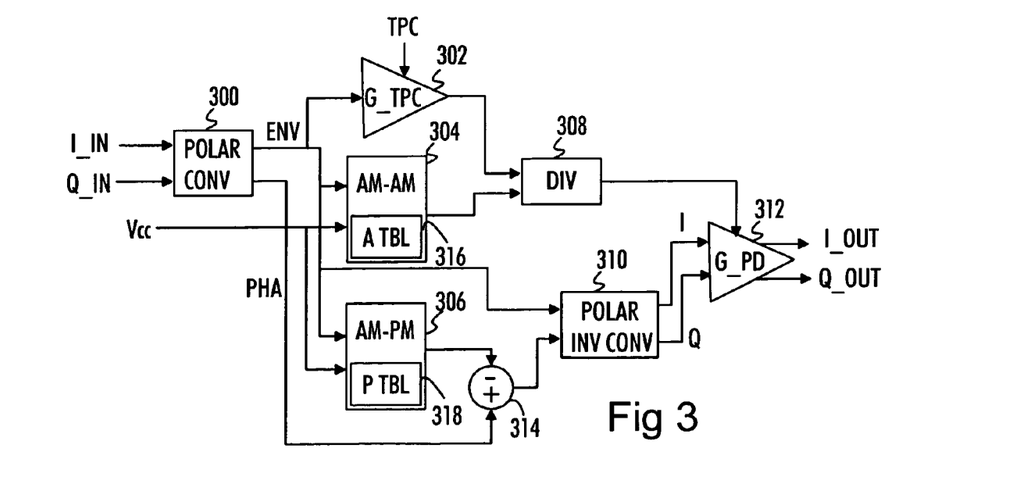
FIG. 3 illustrates a transmission signal predistortion unit according to an embodiment of the invention.

The above-described embodiment referring to FIG. 3 carries out the predistortion of the transmission signal appropriately, but it contains a few aspects that may be improved. First of all, the embodiment comprises a division operation which is known to consume a lot of resources in actual implementations. Additionally, the scaling amplifier 312 may be removed through proper design of the predistortion unit 106. This may be carried out by connecting the output of the divider 308 to an envelope component input of the inverse conversion unit 310.

Figure 4:
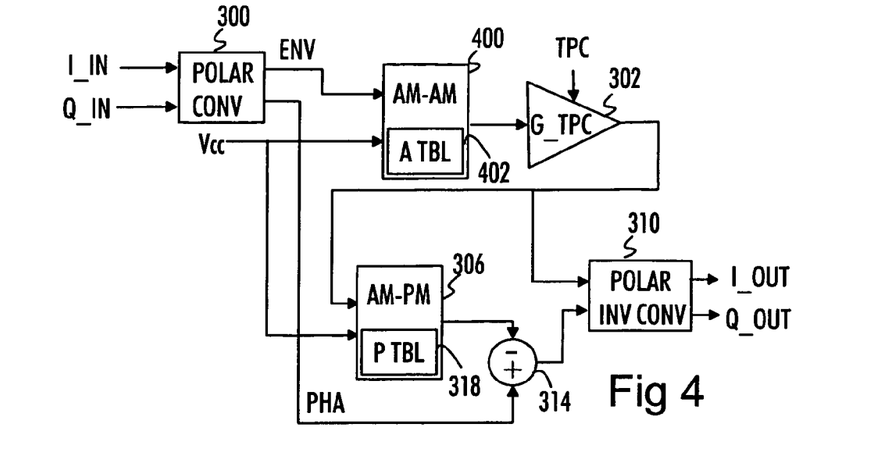
FIG. 4 illustrates a transmission signal predistortion unit according to another embodiment of the invention.
Figure 9:
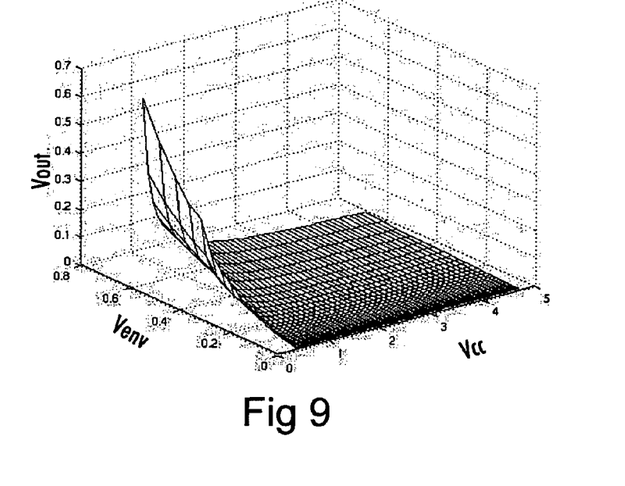
FIG. 9 illustrates the structure of a modified amplitude distortion lookup table utilized by a transmission signal predistortion unit according to an embodiment of the invention.

FIG. 4 illustrates a preferred design of the predistortion unit 106 according to an embodiment of the invention. The components denoted with the same numerals as in FIG. 3 perform the same above-described operations. In the embodiment of FIG. 4, the division and multiplication operations have been calculated beforehand and included in a modified amplitude distortion lookup table 402 comprised in an envelope predistortion unit 400 according to this embodiment of the invention. The modified amplitude distortion lookup table 402 may be calculated from the amplitude distortion lookup table 316 described above with reference to FIG. 3 according to the following equation:

$$V'_{env}(V_{env}, V_{cc}) = \frac{V_{env}^2}{f(V_{env}, V_{cc})} \quad (1)$$

where $V'_{env}$ represents an output value of the modified amplitude distortion lookup table 402 as a function of the envelope component ENV value $V_{env}$ and the value of the signal modeling the power supply voltage $V_{cc}$ applied to the power amplifier 116. $f(V_{env}, V_{cc})$ represents a value obtained from the amplitude distortion lookup table 316 of the embodiment of FIG. 3 for the given values of $V_{env}$ and $V_{cc}$. FIG. 9 illustrates an example of the modified amplitude distortion lookup table 402 calculated from the amplitude distortion lookup table 316 of FIG. 8A.

With reference to FIG. 4, the converter 300 again converts the input I component and the Q component of the transmission signal into the envelope component ENV and the phase component PHA. The envelope component is now fed only to the envelope predistortion unit 400. Additionally, the signal Vcc modeling the power supply voltage is input to the envelope predistortion unit 400. The envelope predistortion unit may check the modified amplitude distortion table in order to map the values of the input envelope component ENV and the signal Vcc modeling the power supply voltage into an output voltage value and output a predistorted envelope signal. In this embodiment, the modified amplitude distortion lookup table 402 may provide information from which the envelope predistortion unit 400 may produce the predistorted envelope signal and not just a weighting signal.

The predistorted envelope signal is then fed to the scaling unit 302 which scales the predistorted envelope signal according to the transmit power control signal received from the transmit power control signal generation unit 100. The scaling unit 302 outputs the scaled and predistorted envelope signal to the phase predistortion determination unit 306 and the inverse conversion unit 310. The phase distortion lookup table 318 may be the same as that described above and, accordingly, the phase predistortion determination unit may check the phase distortion lookup table 318 in order to map the values of the input predistorted envelope signal and the signal Vcc into output phase values. Then, the phase component PHA is predistorted in the subtracter 314 with the phase values output from the phase distortion lookup table 318. The predistorted phase component is then fed also to the inverse conversion unit 310 which converts the predistorted envelope component and the predistorted phase component into predistorted in-phase and quadrature components of the transmission signal.

In addition to calculating the division and multiplication operations into the modified amplitude distortion lookup table 402, another improvement in the embodiment described with reference to FIG. 3 is that the predistorted and scaled envelope signal is used as an input signal to the phase predistortion determination unit 306. This improves the accuracy of phase distortion compensation and, thus, improves the performance of the transmission signal predistortion.

Figure 5:
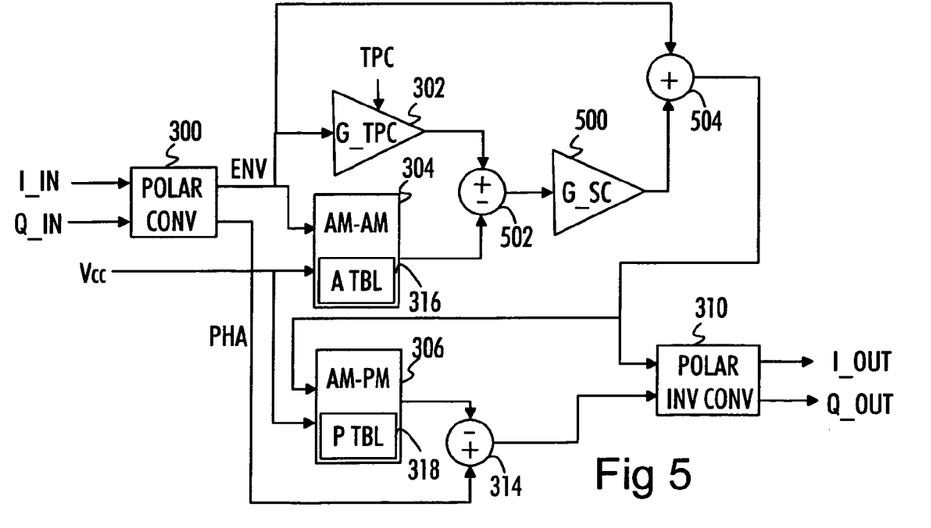
FIG. 5 illustrates a transmission signal predistortion unit according to yet another embodiment of the invention.

FIG. 5 illustrates yet another embodiment of the transmission signal predistortion unit 106. In this embodiment, predistortion is carried out by using a constant-gain method. The envelope component ENV of the transmission signal is fed to the envelope predistortion determination unit 304, an adder 504, and a first scaling unit 302, which corresponds to the scaling unit 302 illustrated in FIGS. 3 and 4. The envelope predistortion determination unit 304 maps the envelope component ENV and the signal Vcc modeling the power supply voltage into an output signal which is then subtracted from the scaled envelope component in a subtracter 502 resulting in an error signal. The resulting error signal is then scaled in a second scaling unit 500 to ensure the constant gain property of the predistortion and added to the original envelope component in the adder 504 to obtain a predistorted envelope component. In fact, the second scaling unit is configured to compensate for the amplification or attenuation caused to the transmission signal by the predistortion. The predistorted envelope component is then applied to the phase distortion determination unit 306 and the inverse conversion unit 310 for phase distortion and inverse conversion back into I and Q component.

In general, the predistortion may cause amplification or attenuation of the transmission signal and, accordingly, affect the operation and properties of the power amplifier 116. As can be seen in the exemplary amplitude distortion lookup table illustrated in FIG. 8A, the distortion caused by the power amplifier 116 may not be linear as the function of the input transmission signal voltage. Accordingly, if the predistortion of the envelope of the transmission signal also causes gain/attenuation to the transmission signal, the power amplifier 116 may not operate at an optimal operational voltage range and the distortion compensation may not be optimal.

Figure 6:
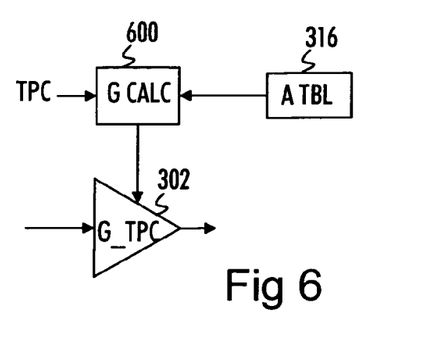
FIG. 6 illustrates calculation of a scaling factor related to the predistortion of the transmission signal according to an embodiment of the invention.

The scaling performed by the scaling unit 302 on the envelope component ENV may be controlled according to an embodiment of the invention illustrated in FIG. 6. The scaling unit 302 may scale the envelope component ENV with a linear gain according to a control signal provided by a gain calculation unit 600. The gain calculation unit 600 may calculate the gain for the scaling unit 302 from the amplitude distortion lookup table 316 and the transmit power control signal. The amplitude distortion lookup table 316 may be the same as that used for the envelope predistortion. Additionally, the gain calculation unit 600 may utilize the knowledge that the first scaling unit 104 of FIG. 1 has scaled the transmission signal to a given level, or other knowledge on the level of the transmission signal. On the basis of the knowledge on the transmission power control signal and the amplitude distortion properties of the power amplifier 116, the gain calculation unit 600 may calculate a gain which scales the level of the predistorted transmission signal to a level which is in a desired operational voltage range of the power amplifier 116 and apply a corresponding control signal to the scaling unit 302. The gain calculation unit 600 may recalculate the gain control signal every time a new transmit power control command is received, i.e. when the transmit power control signal indicates a change in the transmit power.

Figure 7:
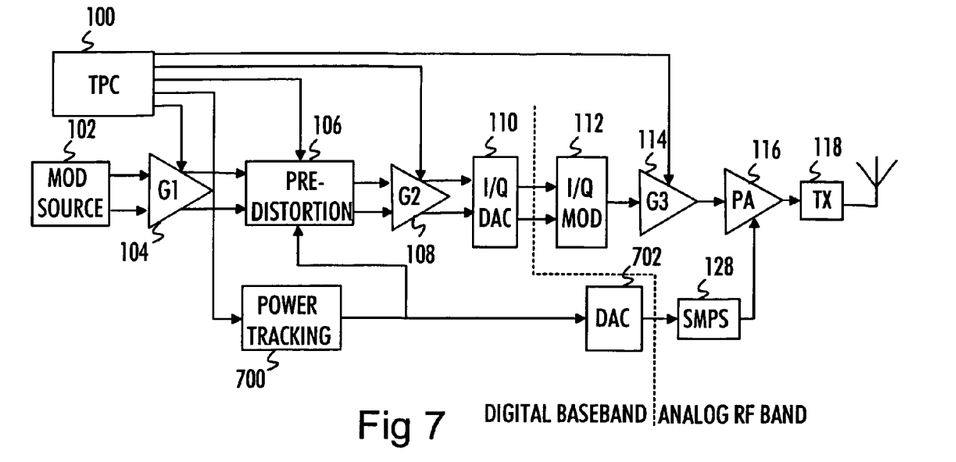
FIG. 7 is a block diagram illustrating components of a radio transmitter according to yet another embodiment of the invention.

FIG. 7 illustrates another embodiment of the invention in which the envelope tracking unit 120 of FIGS. 1 and 2 is replaced with a power level tracking unit 700. The power level tracking unit 700 may be configured to track the power level of the transmission signal. Accordingly, the power level tracking unit 700 may receive a transmit power control signal from the transmit power control signal generation unit 100. On the basis of the received transmit power control signal indicating the transmission power level of the transmission signal, the power tracking unit 700 calculates a control signal for the power supply voltage generator 128 and outputs the control signal to a D/A converter 702 and to the predistortion unit 106. The predistortion unit 106 then uses the control signal as the signal modeling the power supply voltage, and the D/A converter converts the control signal to an analog form and outputs the analog control signal to the power supply voltage generator 128. The power level tracking may provide a more efficient operation of the power amplifier 116 than the envelope tracking in some applications. Such applications may include WCDMA (wideband code division multiple access) and OFDMA (orthogonal frequency division multiple access) data transmission schemes. The degree of improvement depends on the efficiency of the power supply voltage generator 128 (SMPS) with large-bandwidth signals.

Figure 10:
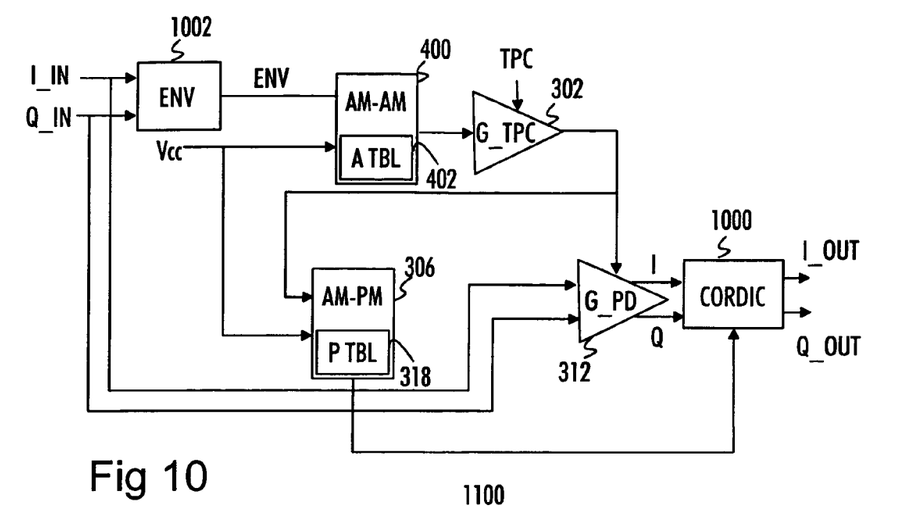
FIG. 10 illustrates an embodiment of the invention in which phase predistortion is performed by a CORDIC algorithm.

In the embodiments of the invention described above, the phase predistortion is performed by subtracting the phase values determined by the phase predistortion determination unit 306 from the phase component of the transmission signal. Alternatively, the phase predistortion may be performed directly on the I and Q components of the transmission signal by utilizing CORDIC algorithm well known in the art. This embodiment is illustrated in FIG. 10. The envelope predistortion may be performed as described above, and the phase predistortion determination unit 306 may also determine the phase predistortion for the transmission signal as described above. The polar conversion performed by the conversion unit 300 in the embodiments described above may, however, be omitted here. In this case, the conversion unit 300 may be replaced with an envelope calculation unit 1002 which calculates the envelope component ENV from the received transmission signal I_IN and Q_IN (I and Q component). The envelope calculation unit 1002 may then output the envelope component ENV into the envelope predistortion determination unit 400. The actual envelope predistortion may be performed in the scaling amplifier 312 in a similar way as in the embodiment described above with reference to FIG. 3. An envelope-predistorted output signal of the scaling amplifier 312, i.e. the envelope-predistorted I and Q component of the transmission signal, are then output to a CORDIC unit 1000.

The CORDIC unit 1000 then predistorts the phase of the input signal according to the phase values received from the phase predistortion determination unit 306. The CORDIC algorithm then outputs a transmission signal having a predistorted envelope and a predistorted phase. The order of the envelope and phase predistortion operations may also be reversed, i.e. the CORDIC unit 1000 may precede the scaling amplifier 312.

In order to minimize the amount of memory capacity required for storing the amplitude and phase distortion lookup tables 316 and/or 402 and 318, the size of the lookup tables may be limited to a predetermined size. The predetermined size of a lookup table may be 16×32 or 32×32, for example. This means that the table comprises 16 or 32 values for the power supply voltage Vcc, 32 values for the voltage of an input envelope signal Venv, and an output value Vout for each combination of the voltage values of Vcc and Venv. If the actual values of the envelope component ENV and the signal modeling the power supply voltage input to the predistortion unit 106 differ from those stored into the lookup tables, the envelope and phase predistortion determination units 304 and/or 400 and 306 may interpolate the output value Vout for the corresponding input values. The interpolation may be carried out according to an interpolation scheme known in the art. The envelope and phase predistortion determination units 304 and/or 400 and 306 may, for example, check the lookup table values close to the received ones and corresponding output values and interpolate the actual output value located between these output values.

In addition to limiting the size of the lookup tables, minimum and/or maximum values of the power supply voltage and input envelope signal voltage may be limited. For example, it may be known that the power supply voltage input to the power amplifier 116 is never lower than 0.4 V, since lower power supply voltage values rapidly increase non-linearity of the power amplifier 116. Accordingly, the lowest power supply voltage, for which an output value is stored into the lookup tables, may be 0.4V.

As mentioned above, the amplitude distortion lookup table 316 and/or 402 and the phase distortion lookup table 318 may be measured and calculated beforehand and stored into the memory unit of the radio transmitter. Accordingly, the lookup tables remain substantially fixed over time, i.e. the values of the lookup tables are not changed. The properties of the power amplifier 116 may, however, change over time as the function of transmission parameters and temperature of the power amplifier 116, for example. In order to counter the changing properties of the power amplifier 116, a plurality of amplitude distortion lookup tables 316 and/or 402 and phase distortion lookup tables 318 may be measured and calculated and stored into the memory unit of the radio transmitter. The predistortion unit 106 may correspondingly include logic to select an appropriate amplitude and phase distortion lookup table on the basis of at least one of the following: the transmission parameters and the measured temperature of the power amplifier 116.

Figure 11A:
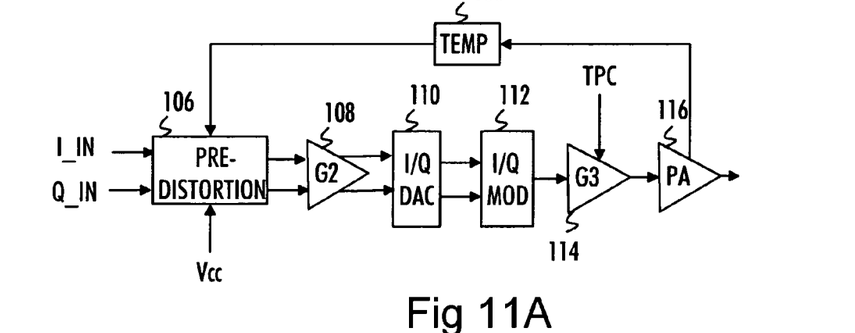
FIG. 11A illustrates components of a radio transmitter according to an embodiment of the invention in which information on power amplifier properties is utilized for selecting lookup tables.
Figure 11B:
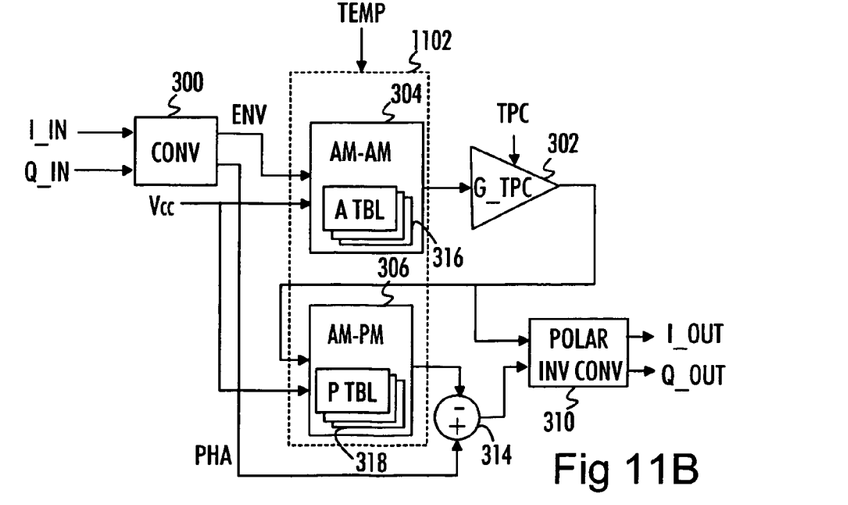
FIG. 11B illustrates a transmission signal predistortion unit according to an embodiment of the invention in which amplitude and phase distortion lookup tables are selected on the basis of the information on at least the power amplifier properties.

FIGS. 11A and 11B illustrate an embodiment of the invention in which a temperature of the power amplifier 116 is measured and the lookup tables are selected accordingly. Referring to FIG. 11A, a sensor of a temperature measurement unit 1100 may be connected to the power amplifier 116 to measure the temperature of the power amplifier 116. The temperature measurement unit 1100 may then provide the predistortion unit 106 with information on the measured temperature of the power amplifier 116.

Referring to FIG. 11B, the predistortion unit 106 receives the information on the temperature of the power amplifier 116. Additionally, the predistortion unit 106 may receive information on transmission parameters such as transmission frequency, and other information needed for the selection of proper lookup tables. On the basis of this information, a lookup table selection unit 1102 of the predistortion unit 106 may select an amplitude distortion lookup table 316 and a phase distortion lookup table 318 to be used in the predistortion of the transmission signal. The lookup table selection unit 1102 may comprise logic to associate each combination consisting of the transmission parameters, the temperature of the power amplifier 116 and other information to a given amplitude distortion lookup table 316 and a given phase distortion lookup table 318. The lookup table selection unit 1100 may be included in any embodiment of the predistortion unit 106 described above.

As shown in FIGS. 1, 2, and 7, the first scaling circuit 104 scales the I and Q component of the transmission signal received from the modulation source 102 to a level suitable for the predistortion unit 106. Alternatively, the first scaling unit 104 may be incorporated in the predistortion unit 106. In the predistortion unit 106, the scaling may be applied to the envelope component ENV after the polar conversion performed by the conversion unit 300. The envelope component ENV may then be scaled before the envelope predistortion determination unit 304 (or 400) on the basis of a control signal received from the transmit power control signal generation unit 100. This scaling may be formulated to represent the total gain in the whole signal chain from the modulation source 102 to the input of the power amplifier 116. Accordingly, the envelope component may be scaled before the envelope predistortion determination unit 304, and the actual envelope predistortion may be carried out on the non-scaled envelope component in the embodiment described in FIGS. 3.

Signal Vcc representing the power supply voltage of the power amplifier 116 may also be scaled with the signal representing the gain caused to the power supply control signal by the fourth scaling unit 124, the envelope D/A converter 126, and the power supply voltage generator 128 in a current transmit power control state. The scaling of the power supply control signal, i.e. the signal modeling the power supply voltage input to the power amplifier, may also be carried out in the predistortion block in 106. The scaling may be carried out before predistortion determination units 304 (or 400) and 306. Accordingly, signals input to the predistortion determination units 304 and 306 are scaled to a suitable power level and the I/Q signal level is kept optimal for DACs 110 and 126.

Figure 12:
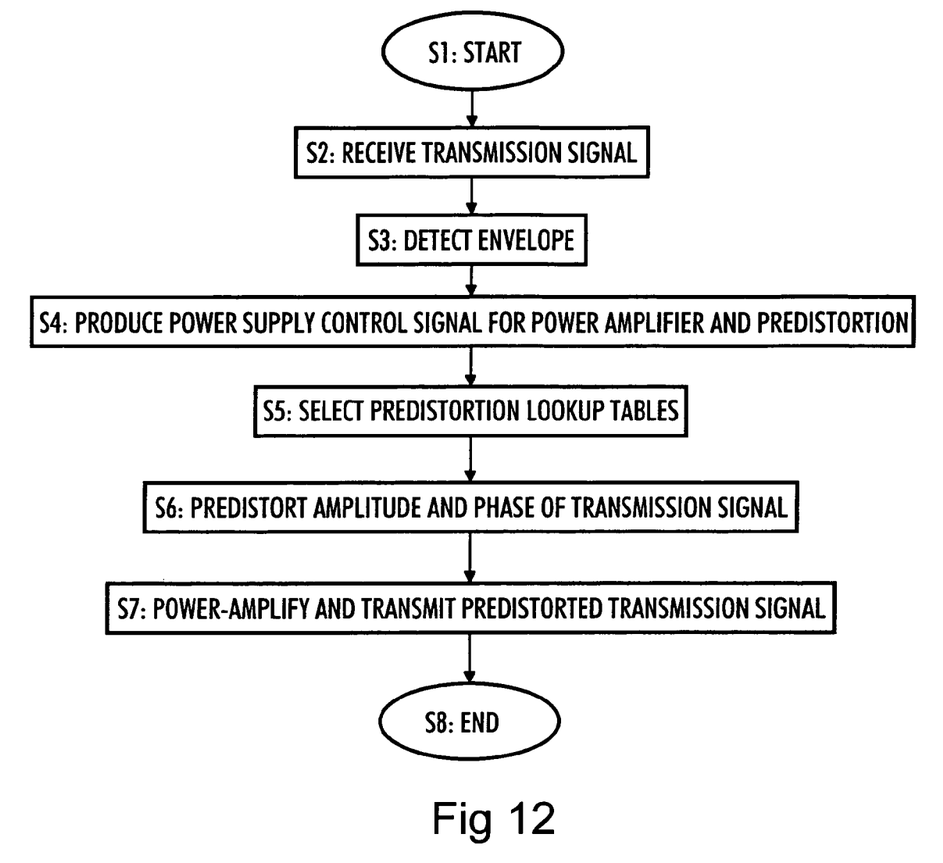
FIG. 12 is a flow diagram illustrating a process according to an embodiment of the invention for predistorting a transmission signal before power amplification.

Next, a process for predistorting a transmission signal according to an embodiment of the invention will be described with reference to a flow diagram of FIG. 12. The process may be carried out in a radio transmitter according to an embodiment of the invention. The process starts in S1.

In S2, a transmission signal is received. The transmission signal may be received from a modulation source outputting data symbols to be transmitted from the radio transmitter over an air interface.

In S3, an envelope of the transmission signal is detected. S3 may include conversion of the transmission signal into an envelope component and a phase component. On the basis of the envelope of the transmission signal, a power supply control signal is generated in S4. The power supply control signal may be modified to track the envelope of the transmission signal to enable sufficient power supply for a power amplifier configured to power-amplify the transmission signal. The power supply control signal is then used for predistortion and power amplification of the transmission signal.

In S5, an amplitude distortion lookup table and a phase distortion lookup table are selected for predistortion of the transmission signal. The lookup tables may be selected according to transmission parameters of the transmission signal and/or the temperature of the power amplifier, for example. In general, the lookup tables may be selected on the basis of known current amplitude and phase distortion properties of the power amplifier, i.e. the levels of amplitude and phase distortion caused by the power amplifier.

When the amplitude and phase distortion lookup tables have been selected, the selected lookup tables are used to determine the level of transmission signal predistortion needed to compensate for the amplitude and phase distortion caused by the power amplifier. The level of predistortion is determined from the transmission signal and the power supply control signal. Then, the transmission signal is predistorted in S6 to compensate for the distortion caused by the power amplification in S7. In addition to power amplification, the power-amplified transmission signal is transmitted in S7. The process ends in S8.

The embodiments of the invention may be realized in a radio transmitter comprising a processing unit configured to carry out baseband signal processing operations to signals to be transmitted from the radio transmitter. The processing unit may be implemented by an application-specific integrated circuit (ASIC) or by a digital signal processor configured by suitable software. The processing unit may be configured to perform at least some of the steps described in connection with the flowchart of FIG. 12 and in connection with FIGS. 1 to 7 and 11 to 11B. The embodiments may be implemented as a computer program comprising instructions for executing a computer process for predistorting a transmission signal before power amplification.

The computer program may be stored on a computer program distribution medium readable by a computer or a processor. The computer program medium may be for example, but not limited to, an electric, magnetic, optical, infrared or semiconductor system, device or transmission medium. The computer program medium may include at least one of the following media: a computer readable medium, a program storage medium, a record medium, a computer readable memory, a random access memory, an erasable programmable read-only memory, a computer readable software distribution package, a computer readable signal, a computer readable telecommunications signal, computer readable printed matter, and a computer readable compressed software package.

Even though the invention has been described above with reference to an example according to the accompanying drawings, it is clear that the invention is not restricted thereto but it can be modified in several ways within the scope of the appended claims.

The invention claimed is:

1. A method, comprising:
    receiving a transmission signal to be transmitted and a signal modeling a power supply voltage applied to a power amplifier;
    associating an envelope of the received transmission signal and the signal modeling the power supply voltage with predistortion information comprised in a distortion lookup table, wherein the information in the distortion lookup table is obtained beforehand from transmission signal distortion properties of the power amplifier and remains substantially fixed over time,
    predistorting the received transmission signal according to the associated predistortion information in order to compensate for distortion caused by the power amplifier; and
    scaling the envelope of the received transmission signal according to at least the received transmit power control commands and amplitude distortion lookup table to adjust the envelope of the transmission signal to a desired operational range of the power amplifier.

2. The method of claim 1, wherein the distortion lookup table is an amplitude distortion lookup table comprising envelope predistortion information previously obtained from amplitude distortion properties of the power amplifier, the envelope predistortion information remaining substantially fixed over time, and predistorting the envelope of the received transmission signal according to the associated envelope predistortion information in order to compensate for amplitude distortion caused by the power amplifier.

3. The method of claim 2, wherein the amplitude distortion lookup table comprises predistorted envelope signal values as a function of the envelope of the received transmission signal and the signal modeling the power supply voltage, the method further comprising:
creating a predistorted envelope of the received transmission signal from the amplitude distortion lookup table values corresponding to the values of the envelope of the received transmission signal and the signal modeling the power supply voltage.

4. The method of claim 2, further comprising:
associating the envelope of the received transmission signal and the signal modeling the power supply voltage with phase predistortion information comprised in a phase distortion lookup table wherein the information in the phase distortion lookup table is obtained from phase distortion properties of the power amplifier, the information remaining substantially fixed over time;
predistorting a phase of the received transmission signal according to the associated phase predistortion information in order to compensate for the phase distortion caused by the power amplifier, and
combining the predistorted envelope and the predistorted phase of the transmission signal into the predistorted transmission signal before outputting the predistorted transmission signal for power amplification.

5. The method of claim 4, wherein the predistorted envelope of the received transmission signal and the signal modeling the power supply voltage is associated with the phase predistortion information.

6. The method of claim 4, further comprising:
obtaining the phase predistortion information of the phase distortion lookup table by measuring beforehand the phase distortion caused by the power amplifier as a response to given values of a voltage of an input transmission signal to be power-amplified and to a power supply voltage.

7. The method of claim 4, wherein the phase distortion lookup table comprises values indicating the amount of phase distortion caused by the power amplifier as a function of the envelope of the received transmission signal and the signal modeling the power supply voltage, the method further comprising:
predistorting the phase of the received transmission signal by subtracting the phase distortion caused by the power amplifier from the phase of the received transmission signal.

8. The method of claim 1, further comprising:
obtaining the predistortion information of the distortion lookup table by measuring the distortion caused by the power amplifier as a response to given values of the voltage of an input transmission signal to be power-amplified and to an input power supply voltage.

9. The method of claim 1, further comprising:
producing the signal modeling the power supply voltage to track the envelope of the transmission signal;
filtering the signal modeling the power supply voltage with a non-linear filter which preserves the rise time of the signal and lengthens the fall time of the signal, and
using the filtered signal modeling the power supply voltage when associating the received signals with the amplitude distortion.

10. The method of claim 1, further comprising:
producing the signal modeling the power supply voltage to track the envelope of the transmission signal;
filtering the signal modeling the power supply voltage with a filter having a frequency response of a power supply signal generator providing the power amplifier with the power supply voltage, and
using the filtered signal modeling the power supply voltage when associating the received signals with the amplitude distortion.

11. The method of claim 1, further comprising:
producing the signal modeling the power supply voltage to track the envelope of the transmission signal;
filtering the signal modeling the power supply with a low-pass filter having a corner frequency lower than that of a power supply voltage generator providing the power amplifier with the power supply voltage, and
using the filtered signal modeling the power supply voltage when associating the received signals with the amplitude distortion.

12. The method of claim 1, further comprising:
producing the signal modeling the power supply voltage to track the envelope of the transmission signal;
synchronizing the signal modeling the power supply voltage with the predistorted transmission signal;
providing the power amplifier with the power supply voltage from a power supply voltage generator controlled by the signal modeling the power supply voltage;
power-amplifying the predistorted transmission signal with the power supply voltage synchronized with the predistorted transmission signal, and
transmitting the power amplified transmission signal.

13. The method of claim 1, further comprising:
selecting the distortion lookup table according to at least one of the following criteria: the transmission frequency of the transmission signal, or the temperature of the power amplifier.

14. An apparatus, comprising:
a predistortion unit comprising an interface to receive a transmission signal to be transmitted and a signal modeling a power supply voltage applied to a power amplifier, the predistortion unit being configured to associate an envelope of the received transmission signal and the signal modeling the power supply voltage with predistortion information comprised in a distortion lookup table, wherein the information in the distortion lookup table is obtained from the transmission signal distortion properties of the power amplifier, the predistortion information remaining substantially fixed over time, and to predistort the received transmission signal according to the associated predistortion information in order to compensate for the distortion caused by the power amplifier, and wherein the predistortion unit is further configured to scale the envelope of the received transmission signal according to at least the received transmit power control commands and amplitude distortion lookup table to adjust the envelope of the transmission signal to a desired operational range of the power amplifier.

15. The apparatus of claim 14, wherein the distortion lookup table is an amplitude distortion lookup table comprising envelope predistortion information obtained from amplitude distortion properties of the power amplifier and remaining substantially fixed over time and wherein the predistortion unit is further configured to predistort the envelope of the received transmission signal according to the associated envelope predistortion information in order to compensate for the amplitude distortion caused by the power amplifier.

16. The apparatus of claim 15, wherein the amplitude distortion lookup table comprises predistorted envelope signal values as a function of the envelope of the received transmission signal and the signal modeling the power supply voltage, and the predistortion unit is further configured to create the predistorted envelope of the received transmission signal from the amplitude distortion lookup table values that correspond to the values of the envelope of the received transmission signal and the signal modeling the power supply voltage.

17. The apparatus of claim 15, wherein the predistortion unit is further configured to associate the envelope of the received transmission signal and the signal modeling the power supply voltage with phase predistortion information comprised in a phase distortion lookup table wherein the information in the phase distortion lookup table is obtained from phase distortion properties of the power amplifier, the phase distortion information remaining substantially fixed over time, to predistort the phase of the received transmission signal according to the associated phase predistortion information in order to compensate the phase distortion caused by the power amplifier, and to combine the predistorted envelope and the predistorted phase of the transmission signal into the predistorted transmission signal before outputting the predistorted transmission signal for power amplification.

18. The apparatus of claim 17, wherein the predistortion unit is further configured to associate the predistorted envelope of the received transmission signal and the signal modeling the power supply voltage with the phase predistortion information.

19. The apparatus of claim 17, wherein phase predistortion information of the phase distortion lookup table indicating the phase distortion caused by the power amplifier as a response to given values of the voltage of an input transmission signal to be power amplified and a power supply voltage is stored into the predistortion unit beforehand.

20. The apparatus of claim 17, wherein the phase distortion lookup table comprises values indicating the amount of phase distortion caused by the power amplifier as a function of the envelope of the received transmission signal and the signal modeling the power supply voltage, and the predistortion unit is further configured to predistort the phase of the received transmission signal by subtracting a phase distortion caused by the power amplifier from a phase of the received transmission signal.

21. The apparatus of claim 14, wherein the predistortion information of the distortion lookup table indicates the transmission signal distortion caused by the power amplifier as a response to given values of the voltage of an input transmission signal to be power amplified, and a power supply voltage is stored into the predistortion unit.

22. The apparatus of claim 14, further comprising:
the power amplifier configured to amplify the predistorted transmission signal;
a power supply voltage generator configured to provide the power amplifier with a power supply voltage;
an envelope tracking unit configured to detect an envelope of the received transmission signal and produce the signal modeling the power supply voltage and tracking an envelope of the transmission signal, and
a low-pass filter, wherein the low-pass filter includes a corner frequency lower than that of the power supply voltage generator.

23. The apparatus of claim 14, further comprising:
the power amplifier configured to amplify the predistorted transmission signal;
a power supply voltage generator configured to provide the power amplifier with a power supply voltage;
an envelope tracking unit configured to detect an envelope of the received transmission signal, and produce the signal modeling the power supply voltage and tracking an envelope of the transmission signal;
a filter having a frequency response matched to that of at least the power supply signal generator, the filter being configured to filter the signal modeling the power supply voltage and output the filtered signal modeling the power supply voltage to the predistortion unit.

24. The apparatus of claim 23, wherein the envelope tracking unit is further configured to output the signal modeling the power supply voltage to the filter as a control signal to the power supply voltage generator.

25. The apparatus of claim 14, further comprising:
the power amplifier configured to amplify the predistorted transmission signal;
a power supply voltage generator configured to provide the power amplifier with a power supply voltage;
a power tracking unit configured to detect the power of the received transmission signal, produce the signal modeling the power supply voltage and tracking the power of the transmission signal, and
a low-pass filter having a corner frequency lower than that of the power supply voltage generator.

26. The apparatus of claim 14, further comprising a distortion lookup table selection unit configured to select the distortion lookup table according to at least one of the following criteria: a transmission frequency of the transmission signal, or a temperature of the power amplifier.

27. The apparatus of claim 14, further comprising:
an envelope tracking unit configured to produce the signal modeling the power supply voltage to track the envelope of the transmission signal and to filter the signal modeling the power supply voltage with a non-linear filter which preserves the rise time of the signal and lengthens the fall time of the signal, wherein the predistortion unit is further configured to use the filtered signal modeling the power supply voltage when associating the received signals with the amplitude distortion.

28. A radio transmitter comprising:
a predistortion unit including an interface to receive a transmission signal to be transmitted and a signal modeling a power supply voltage applied to a power amplifier,
the predistortion unit being configured to associate an envelope of the received transmission signal and the signal modeling the power supply voltage with predistortion information included in a distortion lookup table, wherein the predistortion information in the distortion lookup table is obtained from the transmission signal distortion properties of the power amplifier, the predistortion information remaining substantially fixed over time, and to predistort the received transmission signal according to the associated predistortion information in order to compensate for the distortion caused by the power amplifier, and wherein the predistortion unit is further configured to scale the envelope of the received transmission signal according to at least the received transmit power control commands and amplitude distortion lookup table to adjust the envelope of the transmission signal to a desired operational range of the power amplifier.

29. An apparatus, comprising:
receiving means for receiving a transmission signal to be transmitted and a signal modeling a power supply voltage applied to a power amplifier;
associating means for associating an envelope of the received transmission signal and the signal modeling the power supply voltage with predistortion information comprised in a distortion lookup table, wherein the predistorton information in the distortion lookup table is obtained from transmission signal distortion properties of the power amplifier and remains substantially fixed over time,
predistorting means for predistorting the received transmission signal according to the associated predistortion information in order to compensate the distortion caused by the power amplifier; and
scaling means for scaling the envelope of the received transmission signal according to at least the received transmit power control commands and amplitude distortion lookup table to adjust the envelope of the transmission signal to a desired operational range of the power amplifier.

30. A computer program embodied on a computer-readable medium comprising computer code readable by a computer for executing a computer process for transmission signal predistortion, the process comprising:
receiving a transmission signal to be transmitted and a signal modeling a power supply voltage applied to a power amplifier;
associating an envelope of the received transmission signal and the signal modeling the power supply voltage with predistortion information comprised in a distortion lookup table, wherein the predistortion information in the distortion lookup table is obtained from transmission signal distortion properties of the power amplifier and remains substantially fixed over time,
predistorting the received transmission signal according to the predistortion information in order to compensate for the distortion caused by the power amplifier; and
scaling the envelope of the received transmission signal according to at least the received transmit power control commands and amplitude distortion lookup table to adjust the envelope of the transmission signal to a desired operational range of the power amplifier.

31. The computer readable medium of claim 30, wherein the computer-readable medium comprises at least one of a program storage medium, a record medium, a computer readable memory, a computer readable software distribution package, a computer readable signal, a computer readable telecommunications signal, or a computer readable compressed software package.

* * * * *